United States Patent
van Dal

(10) Patent No.: US 9,184,233 B2
(45) Date of Patent: Nov. 10, 2015

(54) STRUCTURE AND METHOD FOR DEFECT PASSIVATION TO REDUCE JUNCTION LEAKAGE FOR FINFET DEVICE

(71) Applicant: Taiwan Semiconductor Manufacturing Company, Ltd., Hsin-Chu (TW)

(72) Inventor: Mark van Dal, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/779,286

(22) Filed: Feb. 27, 2013

(65) Prior Publication Data
US 2014/0239347 A1  Aug. 28, 2014

(51) Int. Cl.
*H01L 21/02* (2006.01)
*H01L 29/06* (2006.01)
*H01L 21/265* (2006.01)
*H01L 21/8234* (2006.01)
*H01L 27/088* (2006.01)
*H01L 21/762* (2006.01)

(52) U.S. Cl.
CPC ...... *H01L 29/0688* (2013.01); *H01L 21/26506* (2013.01); *H01L 21/76224* (2013.01); *H01L 21/823431* (2013.01); *H01L 27/0886* (2013.01)

(58) Field of Classification Search
CPC ............ H01L 21/26506; H01L 29/785; H01L 29/7851; H01L 29/66098; H01L 29/66795; H01L 29/78681; H01L 29/78687; H01L 29/06; H01L 29/02; H01L 21/823431; H01L 27/0886; H01L 29/0688
See application file for complete search history.

(56) References Cited

U.S. PATENT DOCUMENTS

| | | | | |
|---|---|---|---|---|
| 4,126,732 A | * | 11/1978 | Schoolar et al. | 428/698 |
| 5,141,894 A | * | 8/1992 | Bisaro et al. | 438/479 |
| 8,062,963 B1 | | 11/2011 | van Dal | |
| 8,674,413 B1 | * | 3/2014 | Chi | 257/213 |
| 2004/0173843 A1 | * | 9/2004 | Noda | 257/327 |
| 2007/0281433 A1 | * | 12/2007 | Mollat et al. | 438/380 |
| 2008/0054361 A1 | * | 3/2008 | Siprak | 257/365 |
| 2008/0073667 A1 | * | 3/2008 | Lochtefeld | 257/190 |
| 2008/0111185 A1 | * | 5/2008 | Cheng | 257/347 |
| 2008/0179695 A1 | * | 7/2008 | Berthold et al. | 257/408 |
| 2009/0061606 A1 | * | 3/2009 | Mollat et al. | 438/528 |
| 2010/0289116 A1 | * | 11/2010 | Lin et al. | 257/510 |

(Continued)

OTHER PUBLICATIONS

M.J.H. van Dal, et al. "Demonstration of Scaled Ge p-channel FinFET's Integrated on Si," 2012 IEEE, IEDM12-521, pp. 23.5.1-23.5.4.

(Continued)

*Primary Examiner* — Minh-Loan Tran
*Assistant Examiner* — Fazli Erdem
(74) *Attorney, Agent, or Firm* — Haynes and Boone, LLP

(57) ABSTRACT

The present disclosure provides one embodiment of a semiconductor structure. The semiconductor structure includes a semiconductor substrate of a first semiconductor material; shallow trench isolation (STI) features formed in the semiconductor substrate; and a fin-like active region of a second semiconductor material epitaxy grown on the semiconductor substrate. The first semiconductor material has a first lattice constant and the second semiconductor material has a second lattice constant different from the first lattice constant. The fin-like active region further includes fluorine species.

20 Claims, 9 Drawing Sheets

(56) References Cited

U.S. PATENT DOCUMENTS

| | | | |
|---|---|---|---|
| 2011/0062492 A1* | 3/2011 | Ko et al. | 257/190 |
| 2012/0001239 A1* | 1/2012 | Ko et al. | 257/255 |
| 2012/0098042 A1* | 4/2012 | Cai et al. | 257/288 |
| 2012/0172648 A1* | 7/2012 | Seebauer | 585/733 |
| 2013/0099282 A1* | 4/2013 | Chen et al. | 257/190 |
| 2013/0264639 A1* | 10/2013 | Glass et al. | 257/335 |
| 2013/0277746 A1* | 10/2013 | Baldauf et al. | 257/368 |
| 2013/0307021 A1* | 11/2013 | Ching et al. | 257/190 |
| 2013/0330900 A1* | 12/2013 | Pandey et al. | 438/301 |
| 2013/0333613 A1* | 12/2013 | Einav | 117/58 |
| 2014/0151807 A1* | 6/2014 | Chi et al. | 257/348 |
| 2014/0167120 A1* | 6/2014 | Chi et al. | 257/288 |
| 2014/0264492 A1* | 9/2014 | Lee | 257/288 |

OTHER PUBLICATIONS

J.S. Park et al., "Defect Reduction of Selective Ge Epitaxy in Trenches on Si(001) Substrates Using Aspect Ratio Trapping," AIP Applied Physics Letters 90, 052113 (2007), 2007 American Institute of Physics, 3 pages.

Chinese Patent Office Action issued on Apr. 29, 2015 in Patent Application No. 10420557560, 5 pages.

* cited by examiner

STRUCTURE AND METHOD FOR DEFECT PASSIVATION TO REDUCE JUNCTION LEAKAGE FOR FINFET DEVICE

BACKGROUND

Since germanium (Ge) intrinsically has the highest hole mobility of all group IV and III-V semiconductors and has 2 times higher electron mobility than silicon (Si), Ge is considered to replace Si as p-channel material for future complimentary metal-oxide-semiconductor field-effect transistor (CMOS) nodes. It is foreseen that the high-mobility channel material will be co-integrated with Si-based periphery, such as input/output (I/O), electrostatic discharge (ESD). Hence it is imperative to integrate Ge channels on bulk Si wafers.

Due to the large lattice mismatch of Ge and Si it is challenging to grow low-defective Ge epitaxy on Si. Especially, various defects may be introduced during the epitaxy growth. For example, threading dislocation defects are formed in the epitaxy grown Ge layer. Various methods are used to reduce the hetero-epitaxy related defects such as the threading dislocation defects, stacking faults, point defects etc. However, existing methods have various concerns and disadvantages associated with device quality and reliability. For example, in the existing method, the threading dislocation defect is restrained but not eliminated. Since these defects could be electrically active, the formed transistors might still suffer from an increased junction leakage.

Therefore, there is a need for a structure and method to address these concerns for enhanced performance and reduced junction leakage.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
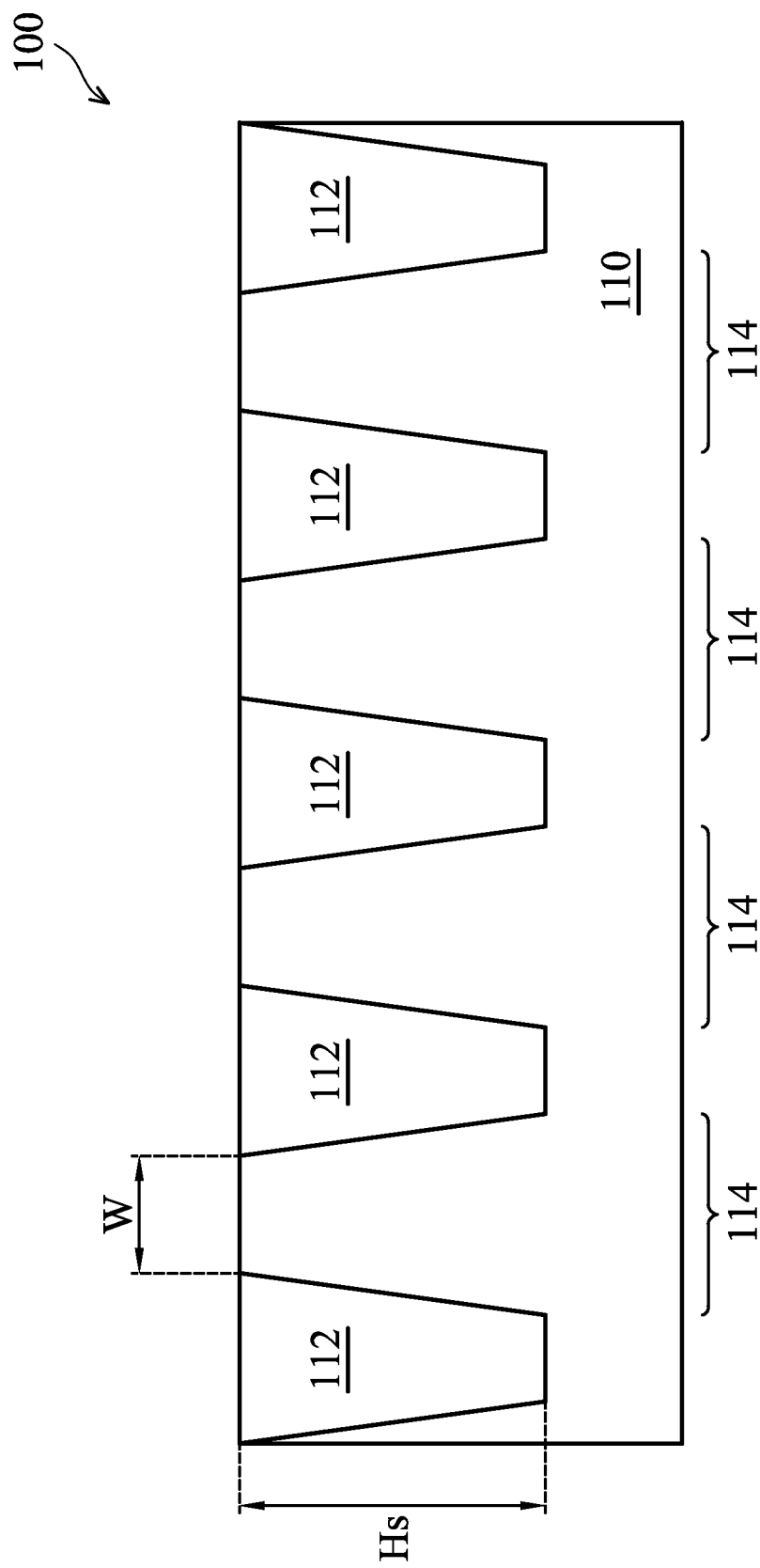
FIGS. 1-6 are sectional views of a semiconductor structure having a fin structure at various fabrication stages constructed according to one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-6 are sectional views of a semiconductor structure 100 at various fabrication stages constructed according to one or more embodiment. In one embodiment, the semiconductor structure 100 includes one or more field effect transistor (FET). FIG. 7 is a flowchart of a method 200 making the semiconductor structure 100 constructed according to one embodiment. The semiconductor structure 100 and the method 200 are collectively described with reference to FIGS. 1-7.

Referring to FIG. 1, the semiconductor structure 100 includes a semiconductor substrate 110 of a first semiconductor material. In the present embodiment, the first semiconductor material is silicon. Alternatively, the first semiconductor material may include other proper semiconductor material. In one embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

Referring to FIGS. 1 and 7, the method 200 begins at operation 202 by forming a plurality of isolation features 112 in the semiconductor substrate 110. In the present embodiment, the isolation features 112 are shallow trench isolation (STI) features.

The STI features 112 are formed in the semiconductor substrate 110 and define various semiconductor regions 114. The semiconductor regions 114 are separated and isolated from each other by the STI features 112. Furthermore, the top surface of the semiconductor substrate 110 and top surfaces of the STI features 112 are coplanar at the present fabrication stage. In one embodiment, the formation of the STI features 114 includes, forming a hard mask with openings that define the regions for STI features; etching the semiconductor substrate 110 through the openings of the hard mask to form trenches; depositing dielectric material to fill in the trenches; and performing a chemical mechanical polishing (CMP) process. In one embodiment, the depth of the STI features 112 ranges between about 30 nm and about 250 nm.

In one embodiment, the formation of the STI features 112 further includes removing the hard mask after CMP. In another embodiment, the hard mask includes a silicon oxide layer by thermal oxidation and a silicon nitride on the silicon oxide layer by chemical vapor deposition (CVD). In yet another embodiment, the hard mask is removed after the CMP process.

In another embodiment, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD).

Especially, the semiconductor regions 114 are designed to with dimensions to achieve aspect ratio trapping (ART) during subsequent epitaxy growth. The ART technology and the dimensions of the semiconductor regions 114 are further described and explained at a later fabrication stage. In the present example, the STI features 112 have a height "Hs" ranging between about 100 nm and about 300 nm. In another example, each of the semiconductor regions 114 has a width "W" ranging between about 5 nm and about 50 nm. The width W of a semiconductor region 114 is a dimension that spans between two adjacent STI features 112.

Other features may be formed on the semiconductor substrate 110. In one example, various doped regions, such as n-well and p-wells, are formed in the semiconductor substrate 110 within the semiconductor regions 114 by one or more implantation or other suitable doping technology.

Figure 2:
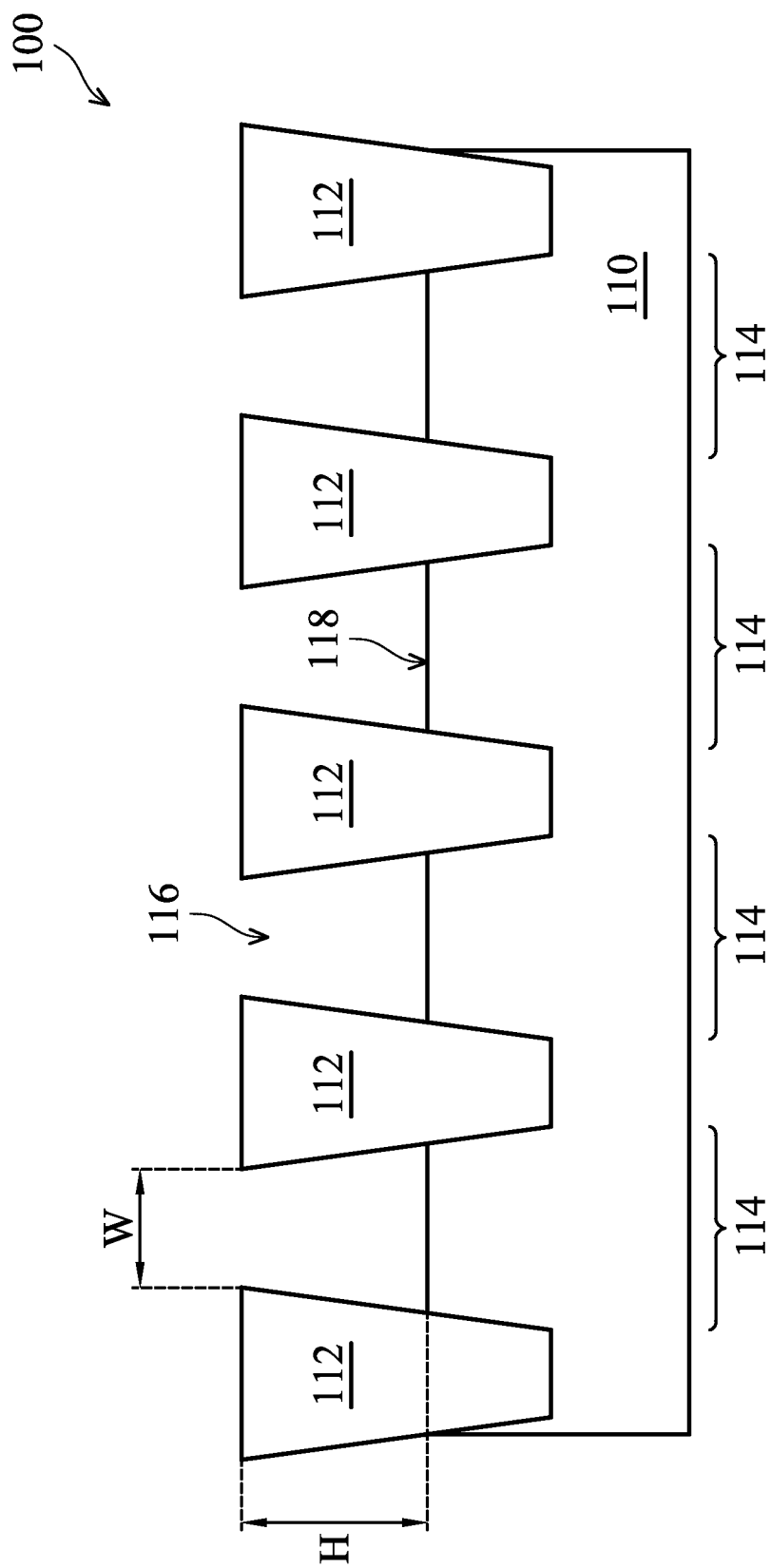

Referring to FIGS. 2 and 7, the method 200 includes an operation 204 by selectively recessing the first semiconductor material of the substrate 110 relative to the STI features 112, resulting in a plurality of recesses 116 in the STI features 112. In the present embodiment, the recessing process includes etch to remove top portions of the semiconductor regions 114 between the STI features 112. Etch to recess the semiconductor regions 114 includes dry etch, wet etch or other suitable etch technology. In one example, etch to recess the semiconductor regions 114 includes gaseous hydrochloric acid (gaseous HCl).

The recessed semiconductor regions 114 have a top surface 118 that is substantially lower than the surface of the STI features 112. In one example, the top surface 118 of the recessed semiconductor regions 114 is substantially lower than the top surface of the STI features 112 and is higher than the bottom surface of the STI features 112. In the present example, the recess depth ranges from about 100 nm and about 300 nm.

Each recess 116 has dimensions including width W and height H as illustrated in FIG. 2. The aspect ratio of the recess 116 is defined as H/W. In the present embodiment, to achieve the aspect ratio trapping, the recess is designed such that the aspect ratio H/W is greater than 1.4.

Figure 3:
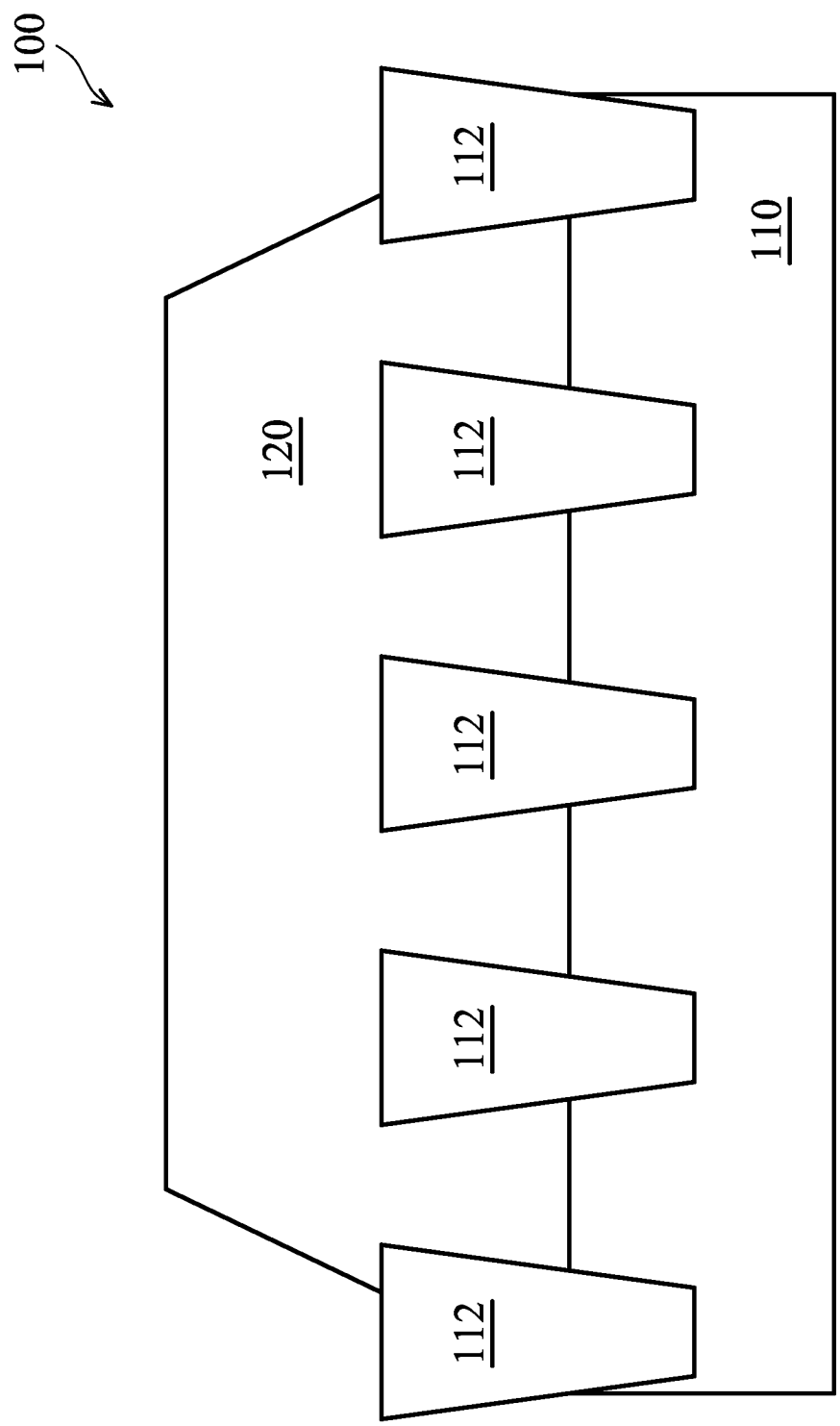

Referring to FIGS. 3 and 7, the method 200 includes an operation 206 by epitaxy growing a second semiconductor material 120 on the recessed semiconductor regions 114. The second semiconductor material is different from the first semiconductor material in composition. Therefore, the epitaxy growth is a hetero epitaxy growth. Especially, the first semiconductor material has a first lattice constant and the second semiconductor material has a second lattice constant that is different from the first lattice constant. Accordingly, there is mismatch between the first and second semiconductor materials at the interface. In one example, the mismatch is 4% or greater. The mismatch in the lattice constant causes defects generated in the second semiconductor material 120. In the present case, the defects include threading dislocation defects and point defects, which are located at the interface between the first and second semiconductor materials and are extended upward.

In one embodiment, the second semiconductor material is different from the first semiconductor material with lattice constant mismatch for strained effect and enhanced mobility. In other embodiments, the first semiconductor material includes silicon and the second semiconductor material includes III-V group compound semiconductor in order to integrate III-V group compound semiconductor active regions on a silicon substrate for high performance (high speed or high frequency) devices using mature silicon fabrication technology.

In one embodiment, the semiconductor substrate 110 includes silicon and the second semiconductor material 120 includes germanium (Ge) or silicon germanium (SiGe) such as $Si_{50}Ge_{50}$.

In another embodiment, the second semiconductor material 120 epitaxy grown in a semiconductor region for p-type FETs includes a semiconductor material selected from the group consisting of silicon germanium, silicon germanium carbide, germanium, silicon and combinations thereof. In another embodiment, the second semiconductor material 120 epitaxy grown in a semiconductor region for n-type FETs includes a semiconductor material selected from the group consisting of silicon phosphoric, silicon carbide, silicon and combinations thereof.

In yet another embodiment, the second semiconductor material 120 for p-type FETs and the second semiconductor material for n-type FETs are both present, different and separately epitaxy grown using respective semiconductor materials. As one example for illustration, the second semiconductor material 120 in a first set of semiconductor regions 114 is for p-type FETs and the second semiconductor material 120 for a second set of semiconductor regions 114 is for n-type FETs.

In yet another embodiment, the second semiconductor material 120 includes III-V group compound semiconductor material, such as indium phosphorous (InP), indium gallium arsenic (InGaAs) or indium arsenic (InAs). In furtherance of the embodiment, the channel regions of the n-type FETs are formed in the second semiconductor material.

The epitaxy growth selectively grows crystalline second semiconductor material on the first semiconductor material in the semiconductor regions 114. The second semiconductor material 120 fills in the recesses 16. To ensure the recesses 116 are filled entirely, the second semiconductor material 120 is over grown to great extent, resulting in excessive portions of the second semiconductor material over the STI features 112. In one example, the over grown portions of the second semiconductor material above the STI features 112 have a thickness ranging between about 100 nm and about 1000 nm. In another example, the over grown portions have a thickness of about 500 nm.

As the recesses 116 have certain aspect ratio H/W (greater than 1.4 in the present embodiment), the threading dislocations are trapped at the bottom portions of the second semiconductor material 120 by the sidewalls of the STI features 112, leaving the top portions of the second semiconductor material 120 defect free. Therefore, the technology is referred to as aspect ration trapping (ART).

Figure 4:
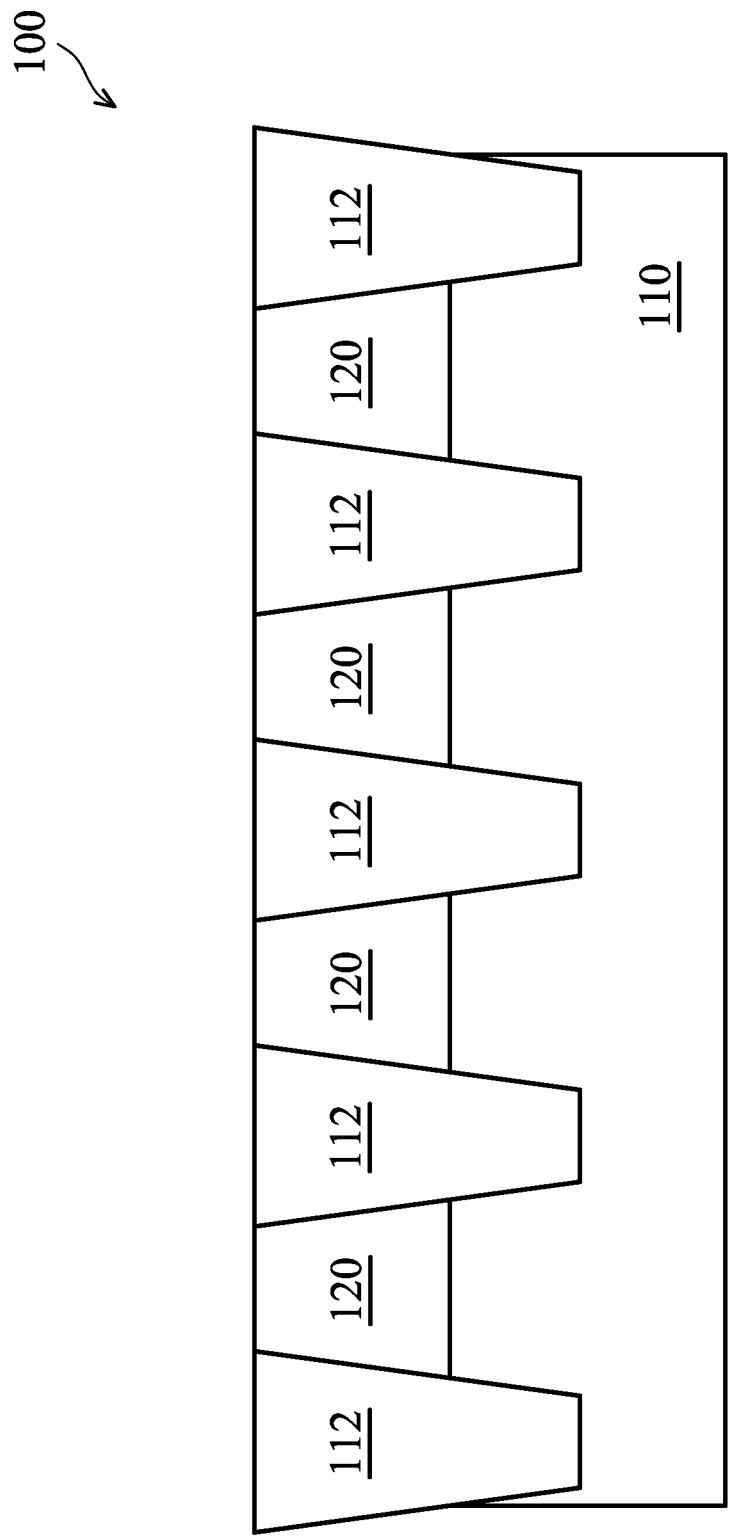

Referring to FIGS. 4 and 7, the method 200 may include an operation 208 to perform a polishing process to remove excessive portions of the second semiconductor material 120 above the top surface of the STI features 112. In the present embodiment, the polishing process is a chemical mechanical polishing (CMP) applied to the second semiconductor material 120 to remove the extra portion and planarize the top surface of the semiconductor structure 100.

Figure 5:
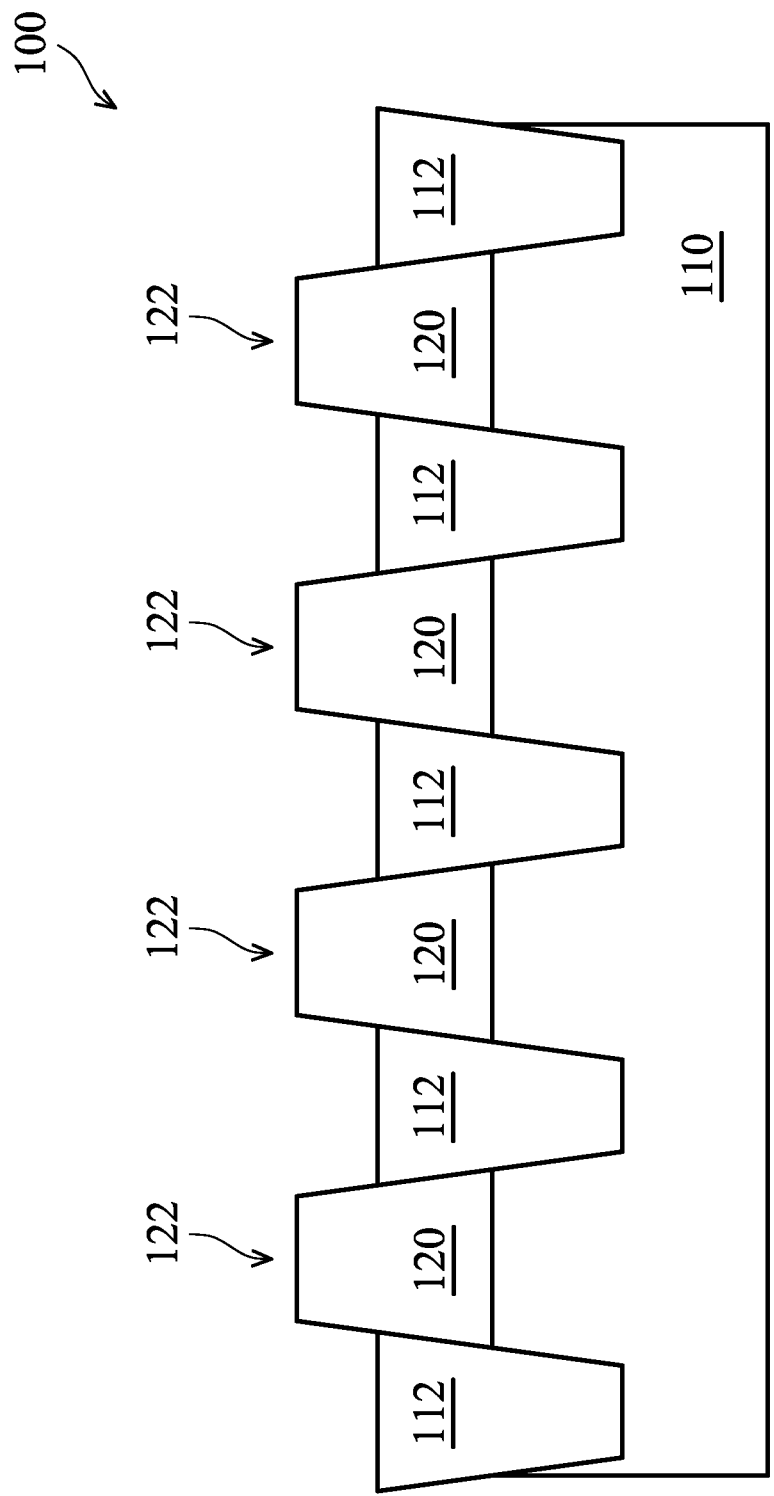

Referring to FIGS. 5 and 7, the method 200 includes an operation 212 to recess the STI features 112, forming fin-like active regions (or fin active regions) 122. An etch process is applied to selectively etch the STI features 112 such that the STI features are recessed. The etch process includes a wet etch or other suitable etch technique to selectively etch the STI features 112. In one embodiment where the STI includes silicon oxide, the etch process uses hydrofluoric (HF) solution. In one example, 2% HF solution is applied to recess the STI features 112 for about 2 minutes.

As noted above, the threading dislocations cannot reach the top portions of the second semiconductor material 120. This is more suitable for fin-like field effect transistors (FinFETs) since FinFETs intrinsically have a high height-to-width aspect ratio.

Figure 6:
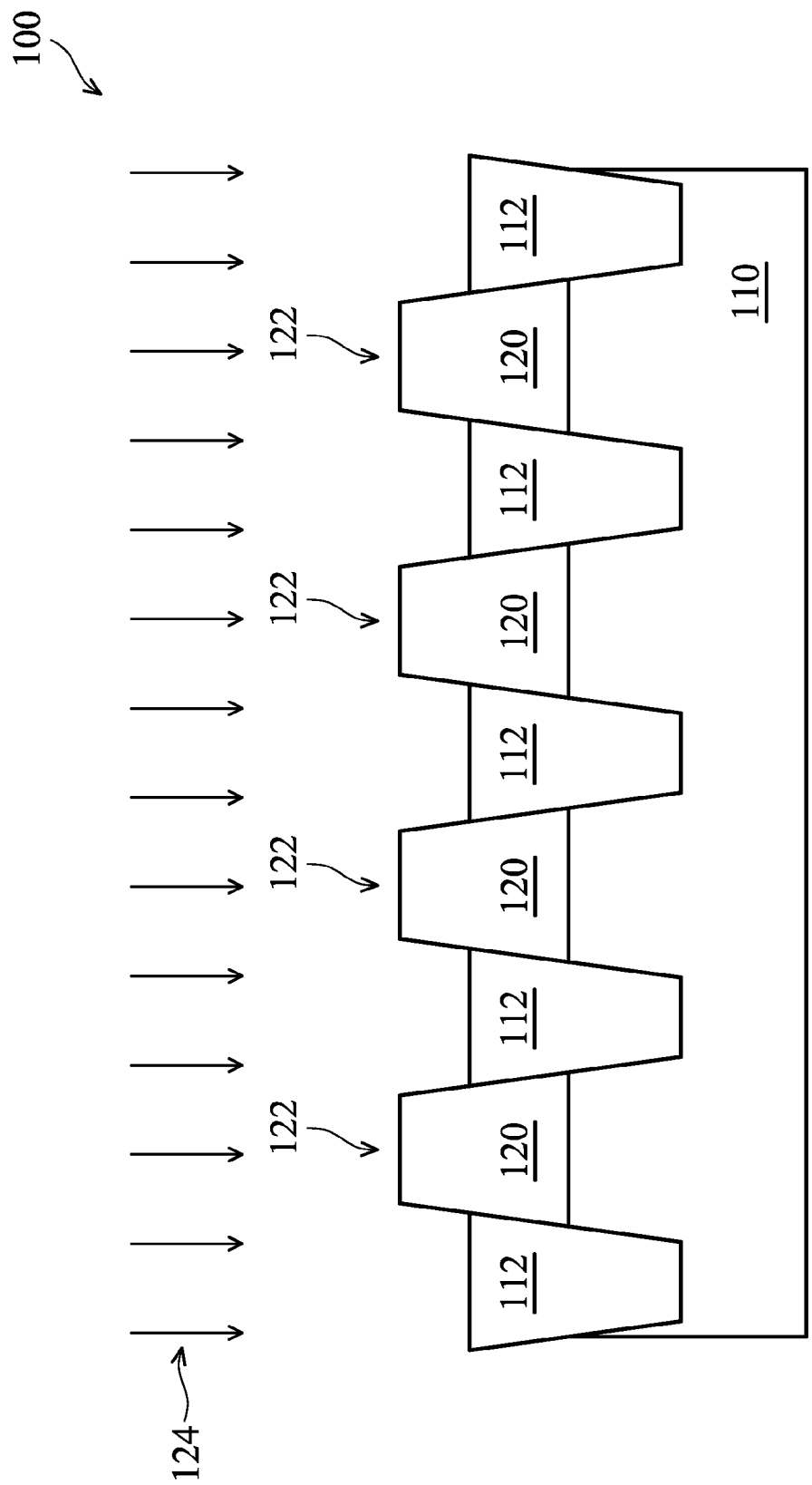
Figure 7:
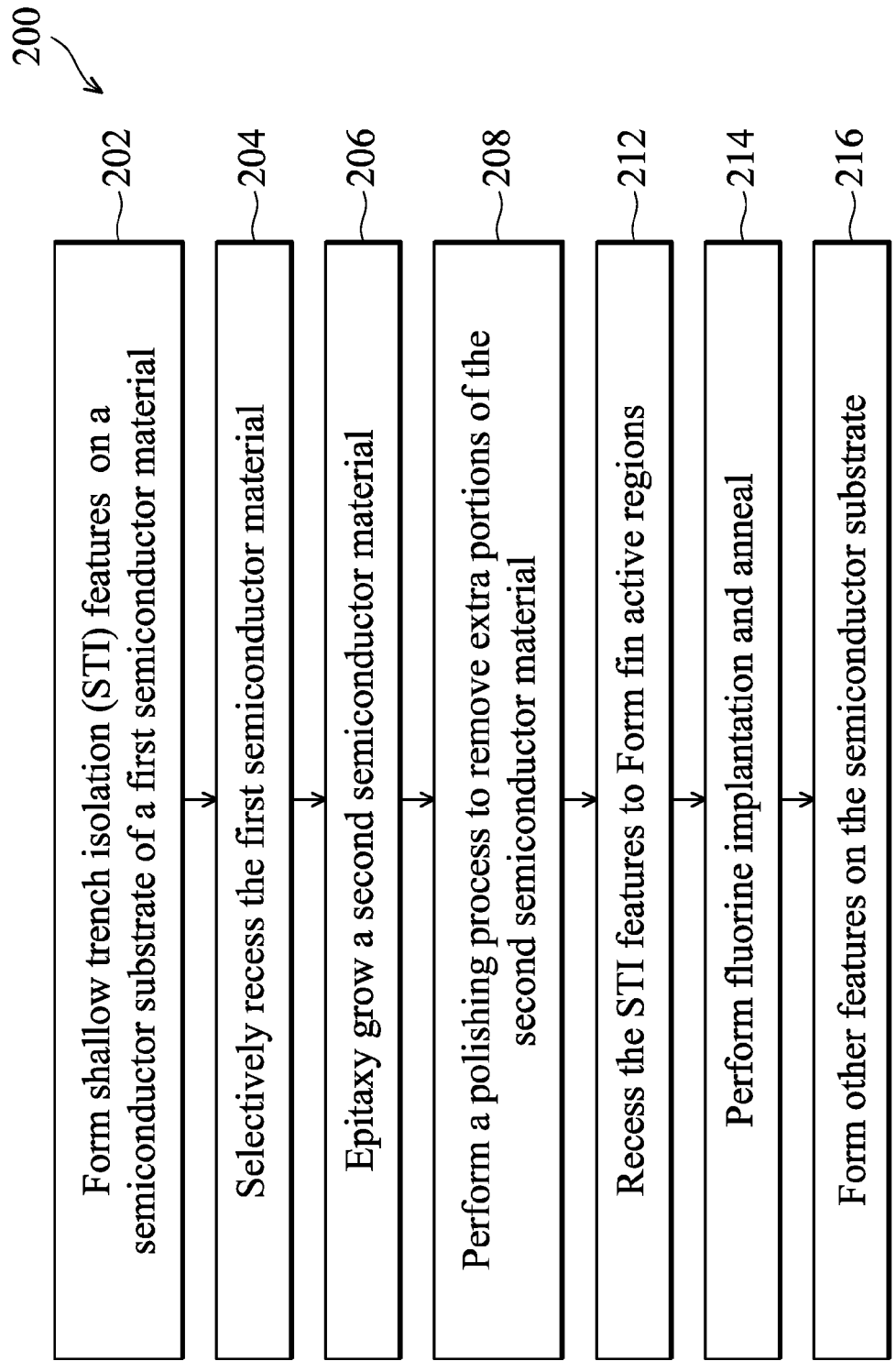
FIG. 7 is a flowchart of a method to form the semiconductor structure of FIG. 6 constructed according to one embodiment.

Referring to FIGS. 6 and 7, the method 200 includes an operation 214 to perform an ion implantation process 124 to introduce inactive doping species to the fin active regions 122. In the present embodiment, an annealing process is implemented after the inactive implantation. Especially, the inactive doping species is small in size to be able to deactivate the defects, such threading dislocation defects. The annealing process help to further distribute the inactive doping species to effectively deactivate the threading defects. It is noted that the inactive doping is different from n-type or p-type doping and has no effect of n-type doping and p-type doping. The inactive doping will not change the doping type of the second semiconductor material 120 whether it is n-type, p-type or neutral. The ion implantation and the annealing process are designed to have the inactive doping substantially distributed in the bottom portions of the fin active regions 122. It is preferable that the inactive doping profile in the vertical direction has a doping concentration peak that coincides with the defect areas in the fin active regions 122. In one example, the doping concentration peak is substantially near the interface between the first and second semiconductor materials.

In the present embodiment, the inactive doping is fluorine (F). In one embodiment where the second semiconductor material is germanium, the fluorine is introduced to the fin active regions 122 by an implantation process with fluorine energy ranging between about 20 KeV and about 200 KeV and a fluorine dose ranging between about $1 \times 10^{12}/cm^2$ and $1 \times 10^{16}/cm^2$. In furtherance of the embodiment, the annealing process includes an annealing temperature ranging between about 400° C. and about 700° C. Accordingly, the thus formed fin active regions 122 have an inactive doping profile with a doping concentration peak ranging between about $1 \times 10^{17}/cm^3$ and $1 \times 10^{21}/cm^3$ and located at a vertical position (from the top surface) ranging between about 100 nm and about 500 nm.

In another embodiment where the second semiconductor material is silicon germanium ($Si_{50}Ge_{50}$), the fluorine is introduced to the fin active regions 122 by an implantation process with fluorine energy ranging between about 10 KeV and about 80 KeV and a fluorine dose ranging between about $1 \times 10^{12}/cm^2$ and $1 \times 10^{16}/cm^2$. In furtherance of the embodiment, the annealing process includes an annealing temperature ranging between about 500° C. and about 900° C. Accordingly, the thus formed fin active regions 122 have an inactive doping profile with a doping concentration peak ranging between about $1 \times 10^{17}/cm^3$ and $1 \times 10^{21}/cm^3$ and located at a vertical position (from the top surface) ranging between about 100 nm and about 500 nm.

In other embodiments, other inactive doping species with small size may be alternatively used for the same purpose. For example, chlorine (Cl)), sulfur (S) or selenium (Se) may be used for inactive doping.

Figure 8:
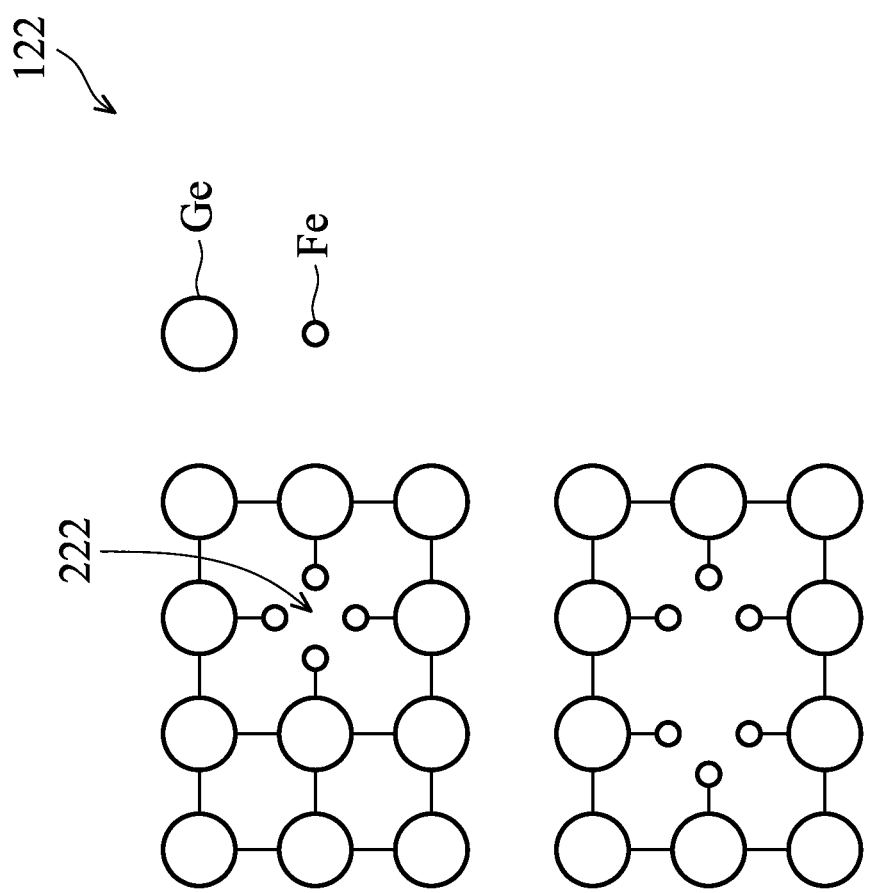
FIG. 8 is a schematic view of an epitaxy grown semiconductor material, in portion, of FIG. 6 constructed according to one embodiment.

As noted above, even with the aspect ratio trapping, the threading dislocations are still present. The defects are trapped at the bottom portions of the fin active regions 122 at the interface between the first and second semiconductor materials but the experiments show that these defects are electrically active and may cause channel leakage. The inactive doping effectively reduces the activity of those defects. It is illustrated in FIG. 8 as a schematic view of the fin active region 122, in portion, of the second semiconductor material 120. In the present example, the second semiconductor material 120 is germanium (large dots in FIG. 8). The fin active region 122 is in crystalline structure and includes an exemplary defect 222. The inactive doping species fluorine (small dots in FIG. 8) distributes to and deactivates the defect 222.

Figure 9:
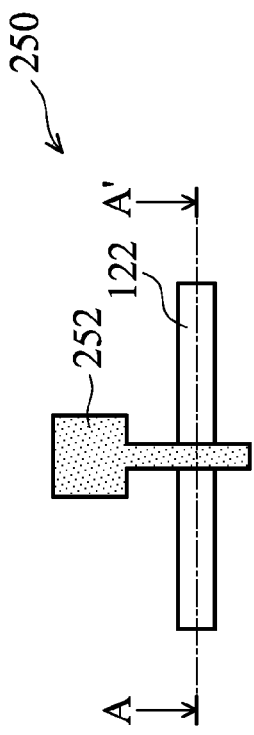
FIG. 9 is a top view of a semiconductor structure, in portion, having a fin structure constructed according to one embodiment.
Figure 10:
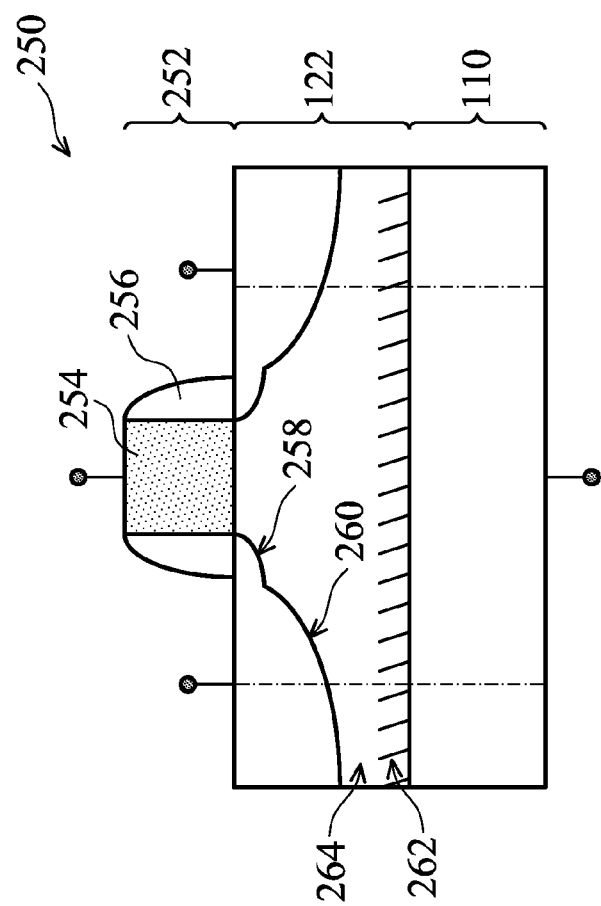
FIG. 10 is a sectional view of the semiconductor structure of FIG. 9 constructed according to one embodiment.

The method 200 includes other operations 216 to form various device features, such as gate stacks, source and drain features configured to form various fin field effect transistors (FinFETs). The operations 216 also include forming a interconnect structure configured to couple the FETs and other devices to form a functional circuit. The operations 216 are further described with reference to FIGS. 9 and 10 for illustration. FIG. 9 is a top view of a semiconductor structure 250 constructed according to aspects of the present disclosure in one embodiment. FIG. 10 is a sectional view of the semiconductor structure 250, taken from the dashed line AA', constructed according to aspects of the present disclosure in one embodiment. In one embodiment, the semiconductor structure 250 is an example of the semiconductor structure 100, in portion.

A gate 252 is formed over the substrate 110 and the fin active region 122. The gate 252 includes a gate stack 254 having a dielectric layer and a gate electrode layer on the gate dielectric layer. The gate dielectric layer includes a dielectric material, such as silicon oxide, germanium oxide, high k dielectric material layer or a combination thereof. In another embodiment, the gate dielectric layer includes an interfacial layer (such as a silicon oxide or germanium oxide layer) and a high k dielectric material layer on the interfacial layer. The gate electrode layer includes a conductive material layer, such as doped polycrystalline silicon (polysilicon), metal, metal alloy or combinations thereof.

The gate stack 254 may be formed by a procedure that includes forming a gate dielectric layer, forming a gate electrode layer on the gate dielectric layer, and patterning the gate electrode layer and the gate dielectric layer. The formation of the gate stack 254 may further include a gate replacement procedure to replace the previously formed gate stack with high k dielectric and metal. The gate replacement may include a gate last operation or a high k last operation where both gate dielectric and gate electrode are replaced at a later fabrication stage.

The gate 252 may also include gate spacer 256 formed on sidewalls of the gate stack 254 by a procedure that includes deposition and anisotropic etch.

The operations 216 also include forming various source and drain features on the fin active regions 122. The source and drain features are formed on bother sides of the gate 252 and are configured with the gate 252 to form a FinFET. The source and drain features may include both light doped drain (LDD) features 258 and heavily doped source and drain (HDD) features 260. Source and drain features are formed by ion implantation or other suitable technique. A channel is formed in the fin active region 122 under the gate stack and is defined between the source and drain features. In one example, the gate 252 and the source and drain features are formed by a procedure that includes forming the gate stack 254, forming LDD features 258, forming the gate spacer 256 and forming HDD features 260.

In one embodiment, the operations 216 also include forming an interconnect structure on the substrate 110 to provide electrical routing and couple various devices to form a functional circuit.

The interconnect structure includes horizontal conductive features (metal lines) and vertical conductive features (such as vias and contacts). The interconnect structure includes conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable process. The metal silicide used in multilayer interconnects may include nickel silicide, cobalt silicide, tungsten silicide, tantalum silicide, titanium silicide, platinum silicide, erbium silicide, palladium silicide, or combinations thereof.

The interconnect structure further includes an interlayer dielectric (inter-level dielectric or ILD) to isolate various conductive features (metal lines, vias and contacts). The ILD can be a material of a low dielectric constant (low-k) such as a dielectric constant less than about 3.5. The ILD may include silicon dioxide, silicon nitride, silicon oxynitride, polyimide, spin-on glass (SOG), fluoride-doped silicate glass (FSG), carbon doped silicon oxide, low-k dielectric material, and/or other suitable materials. The ILD may be formed by a technique including spin-on, CVD, sputtering, or other suitable processes.

Other fabrication steps may be implemented before, during and after the operations of the method 200.

The method 200 and the semiconductor structure made thereby are described above in various embodiments. Different advantages may present in some embodiments. For example, the junction leakage associated with defects is reduced or eliminated. FIG. 10 illustrates defects (threading dislocations) 262 in the fin active regions 122. The threading dislocations are generated at the interface between the first semiconductor material of the substrate 110 and the second semiconductor material of the fin active regions 122 and extend upward. However, the threading dislocations are trapped on the bottom portion of the fin active regions 122 by the sidewalls of the STI features due to the specially designed height-to-width aspect ratio of the fin active regions. Furthermore, the inactive doping (fluorine doping in the present example) to the fin active regions 122 effectively deactivates the trapped threading dislocations (and other defects if present). Thus, the drain-to-bulk leakage currents (such as the leakage in areas 264) is significantly reduced or eliminated, thereby improving the off-state leakage of the corresponding device.

The present disclosure can be used in various applications where dissimilar semiconductor materials are integrated for enhanced performance. In one example, the applications include the strained FinFETs, such as germanium on silicon for n-type FinFETs. In another example, the applications include high speed and high frequency devices formed on a III-V group compound semiconductor layer. In other examples, the disclosed structure and method may be incorporated in various integrated circuits, such as logic circuits, memory devices, sensing devices, radio frequency device or other devices with integration of the dissimilar semiconductor materials.

Thus, the present disclosure provides a semiconductor structure. The semiconductor structure includes a semiconductor substrate of a first semiconductor material; shallow trench isolation (STI) features formed in the semiconductor substrate; and a fin-like active region of a second semiconductor material epitaxy grown on the semiconductor substrate. The first semiconductor material has a first lattice constant and the second semiconductor material has a second lattice constant different from the first lattice constant. The fin-like active region further includes fluorine species.

In one embodiment of the semiconductor structure, the STI features have a first top surface and the fin-like active region has a second top surface that is not coplanar with the first top surface and is extruding from the STI features, and the STI features have a first bottom surface and the fin-like active region has a second bottom surface that is not coplanar with the first bottom surface.

In another embodiment, the fin-like active region of the second semiconductor material has a width W spanning between the two adjacent STI features and a height H measured as a vertical distance from the second top surface to the second bottom surface, and a ratio H/W is greater than 1.4.

In yet another embodiment, the fluorine species has a concentration profile from the second top surface to the second bottom surface, and the concentration profile has a concentration peak substantially in a defect region in the second bottom surface.

In yet another embodiment, the semiconductor structure further includes dislocation defects distributed in the fin-like active region, wherein the threading dislocation defects are deactivated by the fluorine species.

In yet another embodiment, the threading dislocation defects distribute in a lower portion of the fin-like active region and extend upward from the second bottom surface.

In yet another embodiment, the first semiconductor material is silicon, and the second semiconductor material includes germanium.

In yet another embodiment, the first semiconductor material is silicon, and the second semiconductor material a compound semiconductor material selected from the group consisting of silicon germanium (SiGe), indium phosphorus (InP), indium gallium arsenic (InGaAs), and indium arsenic (InAs).

In yet another embodiment, the semiconductor structure further includes a gate stack disposed over the fin-like active region; source and drain features formed in the fin-like active region and interposed by the gate stack; and a channel defined in the fin-like active region, underlying the gate stack and interposed between the source and drain features, wherein the gate stack, the source and drain features, and the channel are configured to form a fin-like field-effect transistor (FinFET).

In yet another embodiment, the fluorine species has a peak concentration ranging between about $1 \times 10^{17}/cm^3$ and about $1 \times 10^{21}/cm^3$.

The present disclosure also provides another embodiment of a semiconductor structure. The semiconductor structure includes shallow trench isolation (STI) features formed in a silicon substrate; defining a silicon region of the semiconductor substrate between two adjacent STI features; an active region of a semiconductor material epitaxy grown on the silicon region and extruding from the adjacent STI features. The silicon substrate has a first lattice constant and the semiconductor material has a second lattice constant different from the first lattice constant. The active region further includes an inactive doping species.

In one embodiment of the FET structure, the inactive doping species is fluorine. In another embodiment, the semiconductor material is germanium, and the inactive doping species has a size less than that of germanium.

In yet another embodiment, the STI features have a first bottom surface and the fin-like active region has a second bottom surface that is not coplanar with the first bottom surface, the active region of the second semiconductor material has a width W spanning between the two adjacent STI features and a height H measured as a vertical distance from a top surface of the active region to a bottom surface of the active region, and a ratio H/W is greater than 1.4.

In yet another embodiment, the active region includes a top surface and a bottom surface, the inactive doping species has a doping concentration profile from the top surface the bottom surface, and the concentration profile has a peak substantially close to the bottom surface.

In yet another embodiment, the semiconductor structure further includes threading dislocation defects that extend upward from a bottom surface of the active region and distribute in a lower portion of the active region, wherein the threading dislocation defects are deactivated by the inactive doping species.

In yet another embodiment, the semiconductor material is a semiconductor material selected from the group consisting of germanium (Ge), silicon germanium (SiGe), indium phosphorus (InP), indium gallium arsenic (InGaAs), and indium arsenic (InAs).

The present disclosure also provides one embodiment of a method of forming a fin field effect transistor (FinFET) structure. The method includes forming a plurality of shallow trench isolation (STI) features in a semiconductor substrate of a first semiconductor material, thereby defining a plurality of semiconductor features separated from each other by the STI features; recessing the semiconductor features; epitaxy growing a second semiconductor material on the recessed semiconductor features to form a plurality of fin active regions of the second semiconductor material, wherein the second semiconductor material has a lattice mismatch with the first semiconductor material, generating threading dislocation defects in the fin active regions; and performing a fluorine implantation to the fin active regions to deactivate the threading dislocation defects formed in the fin active regions.

In one embodiment, the method further includes performing a polishing process to remove excessive second semiconductor material after the expitacy growing a second semiconductor material; and thereafter, recessing the STI features.

In another embodiment, the method further includes performing an annealing process to fluorine doping species in the fin active regions after the performing a fluorine implantation for defect deactivation.

In yet another embodiment, the first semiconductor material is silicon, the epitaxy growing a second semiconductor material includes epitaxy growing silicon germanium, and the annealing process has an annealing temperature ranging between about 500 C. and about 900 C. In yet another embodiment, the performing a fluorine implantation includes performing the fluorine implantation with a dose ranging between about $1\times10^{12}/cm^2$ and about $1\times10^{16}/cm^2$.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a semiconductor substrate of a first semiconductor material;
shallow trench isolation (STI) features formed in the semiconductor substrate; and
a fin-like active region of a second semiconductor material epitaxy grown on the semiconductor substrate, wherein the first semiconductor material has a first lattice constant and the second semiconductor material has a second lattice constant different from the first lattice constant, and
the fin-like active region further includes an inactive doping species selected from the group consisting of sulfur and selenium.

2. The semiconductor structure of claim 1, wherein
the STI features have a first top surface and the fin-like active region has a second top surface that is not coplanar with the first top surface and is extruding from the STI features, and
the STI features have a first bottom surface and the fin-like active region has a second bottom surface that is not coplanar with the first bottom surface.

3. The semiconductor structure of claim 2, wherein
the fin-like active region of the second semiconductor material has a width W spanning between the two adjacent STI features and a height H measured as a vertical distance from the second top surface to the second bottom surface, and
a ratio H/W is greater than 1.4.

4. The semiconductor structure of claim 2, wherein
the inactive doping species has a concentration profile from the second top surface to the second bottom surface, and
the concentration profile has a peak substantially close to the second bottom surface.

5. The semiconductor structure of claim 2, further comprising threading dislocation defects distributed in the fin-like active region, wherein the threading dislocation defects are deactivated by the inactive doping species.

6. The semiconductor structure of claim 5, wherein the threading dislocation defects distribute in a lower portion of the fin-like active region and extend upward from the second bottom surface.

7. The semiconductor structure of claim 1, wherein
the first semiconductor material is silicon, and
the second semiconductor material includes germanium.

8. The semiconductor structure of claim 1, wherein
the first semiconductor material is silicon, and
the second semiconductor material a compound semiconductor material selected from the group consisting of silicon germanium (SiGe), indium phosphorus (InP), indium gallium arsenic (InGaAs), and indium arsenic (InAs).

9. The semiconductor structure of claim 1, further comprising:
a gate stack disposed over the fin-like active region;
source and drain features formed in the fin-like active region and interposed by the gate stack; and
a channel defined in the fin-like active region, underlying the gate stack and interposed between the source and drain features,
wherein the gate stack, the source and drain features, and the channel are configured to form a fin-like field-effect transistor (FinFET).

10. The semiconductor structure of claim 9, wherein the inactive doping species has a peak concentration adjacent an interface between the first semiconductor material and the second semiconductor material.

11. A semiconductor structure, comprising:
shallow trench isolation (STI) features formed in a silicon substrate; defining a silicon region of the semiconductor substrate between two adjacent STI features;
an active region of a semiconductor material epitaxy grown on the silicon region and extruding from the adjacent STI features, wherein the silicon substrate has a first lattice constant and the semiconductor material has a second lattice constant different from the first lattice constant, and the active region further includes an inactive doping species, wherein the inactive doping species is selected from the group consisting of sulfur and selenium.

12. The FET structure of claim 11, wherein the semiconductor material is germanium, and the inactive doping species has a size less than that of germanium.

13. The semiconductor structure of claim 11, wherein the STI features have a first bottom surface and the fin-like active region has a second bottom surface that is not coplanar with the first bottom surface, the active region of the second semiconductor material has a width W spanning between the two adjacent STI features and a height H measured as a vertical distance from a top surface of the active region to a bottom surface of the active region, and a ratio H/W is greater than 1.4.

14. The semiconductor structure of claim 11, wherein the active region includes a top surface and a bottom surface, the inactive doping species has a doping concentration profile from the top surface the bottom surface, and the concentration profile has a peak substantially close to the bottom surface.

15. The semiconductor structure of claim 11, further comprising threading dislocation defects that extend upward from a bottom surface of the active region and distribute in a lower portion of the active region, wherein the threading dislocation defects are deactivated by the inactive doping species.

16. The semiconductor structure of claim 11, wherein the semiconductor material is a semiconductor material selected from the group consisting of germanium (Ge), silicon germanium (SiGe), indium phosphorus (InP), indium gallium arsenic (InGaAs), and indium arsenic (InAs).

17. A semiconductor structure, comprising:

a plurality of recessed shallow trench isolation (STI) features in a semiconductor substrate of a first semiconductor material, thereby defining a plurality of semiconductor features separated from each other by the STI features;

an epitaxially grown second semiconductor material on the recessed semiconductor features to form a plurality of fin active regions of the second semiconductor material, wherein the second semiconductor material has a lattice mismatch with the first semiconductor material, generating threading dislocation defects in the fin active regions; and an inactive doping species implanted in the fin active regions to deactivate the threading dislocation defects formed in the fin active regions, wherein the inactive doping species is selected from the group consisting of sulfur and selenium.

18. The structure of claim 17, further comprising:

wherein a top surface of the second semiconductor material is polished.

19. The structure of claim 17, wherein the first semiconductor material is silicon, and the second semiconductor material includes silicon germanium.

20. The structure of claim 17, wherein the inactive doping species has a peak concentration adjacent an interface between the first semiconductor material and the second semiconductor material.

\* \* \* \* \*